(12) United States Patent
Fan

(10) Patent No.: US 11,881,639 B2
(45) Date of Patent: Jan. 23, 2024

(54) SIGNAL ISOLATION AND TRANSMISSION DEVICE

(71) Applicant: SHENZHEN ZHIYONG ELECTRONICS CO., LTD., Guangdong (CN)

(72) Inventor: Xiaoming Fan, Guangdong (CN)

(73) Assignee: SHENZHEN ZHIYONG ELECTRONICS CO., LTD., Shenzhen (CN)

( * ) Notice: Subject to any disclaimer, the term of this patent is extended or adjusted under 35 U.S.C. 154(b) by 174 days.

(21) Appl. No.: 17/640,829

(22) PCT Filed: Jun. 17, 2020

(86) PCT No.: PCT/CN2020/096487
§ 371 (c)(1),
(2) Date: Mar. 6, 2022

(87) PCT Pub. No.: WO2021/232523
PCT Pub. Date: Nov. 25, 2021

(65) Prior Publication Data
US 2022/0344820 A1 Oct. 27, 2022

(30) Foreign Application Priority Data

May 21, 2020 (CN) .......................... 202010436684.5

(51) Int. Cl.
*H01Q 7/08* (2006.01)
*H01Q 1/38* (2006.01)
*H01Q 1/52* (2006.01)

(52) U.S. Cl.
CPC ................. *H01Q 7/08* (2013.01); *H01Q 1/38* (2013.01); *H01Q 1/526* (2013.01)

(58) Field of Classification Search
CPC .... H01Q 1/22; H01Q 1/38; H01Q 1/521–526; H01Q 7/08; H01Q 7/00
See application file for complete search history.

(56) References Cited

U.S. PATENT DOCUMENTS 8,552,821 B2 * 10/2013 Nagai ..................... H01F 38/14
  310/320
9,189,667 B2 * 11/2015 Bourilkov ............ G06K 19/077
(Continued)

FOREIGN PATENT DOCUMENTS

CN     103188202 A     7/2013
CN     103607225 A     2/2014
(Continued)

OTHER PUBLICATIONS

International Search Report of PCT Patent Application No. PCT/CN2020/096487 dated Feb. 23, 2021.

*Primary Examiner* — Hasan Islam

(57) ABSTRACT

The invention provides a signal isolation and transmission device, comprising a high-frequency amplitude modulation circuit, a signal demodulation circuit, a first H-field antenna and a second H-field antenna. The first H-field antenna and second H-field antenna are both loop antennas with an external conductive shielding layer, and an insulating layer is wrapped outside the conductive shielding layer. The annular parts of the first H-field antenna and second H-field antenna face and abut each other. The high-frequency amplitude modulation circuit is connected with a pin of the first H-field antenna, and a pin of the second H-field antenna is connected with the signal demodulation circuit. The signal to be tested is modulated onto a high-frequency carrier signal by the high-frequency amplitude modulation circuit, and then isolated and transmitted by the two H-field anten- (Continued)

nas, which greatly improves the anti-interference effect, reduces the attenuation degree and improves the coupling degree of the signals.

15 Claims, 7 Drawing Sheets

(56) References Cited

U.S. PATENT DOCUMENTS 9,224,534 B2 * 12/2015 Nagai ..................... H01P 7/084
2008/0143583 A1    6/2008 Welle et al.

FOREIGN PATENT DOCUMENTS

| CN | 207150589 U | 3/2018 |
| CN | 207339849 U | 5/2018 |
| CN | 207459191 U | 6/2018 |
| CN | 108490763 A | 9/2018 |
| CN | 207852936 U | 9/2018 |

* cited by examiner

SIGNAL ISOLATION AND TRANSMISSION DEVICE

The present application claims the benefit of Chinese patent application No. 202010436684.5, titled "Signal isolation and transmission device", and filed on May 21, 2020.

TECHNICAL FIELD

The present application relates to the technical field of electronics, in particular to a signal isolation and transmission device.

BACKGROUND

In the electronic and electrical field, for AC/DC broadband voltage signals, in the prior art, the voltage signal isolation circuit is usually adopted to transmit the voltage to be measured from the dangerous primary side of high voltage to the secondary side of low voltage before measurement and control. The isolation technologies commonly used in these voltage signal isolation circuits include a transformer isolation, a photoelectric coupler and an analog-to-digital isolation.

However, these isolation technologies all have the problems of small bandwidth and weak anti-interference capability. Especially when there are a large number of common-mode electromagnetic field interference signals of below 100 MHZ around the environment to be tested, the isolation degree of the high-frequency interference signals by the primary side and secondary side of the above isolation technology is not enough, which makes the secondary side circuit vulnerable to interference, resulting in obvious interference signals often superimposed on the useful signals to be tested, which greatly affects the accuracy of measurement.

SUMMARY

The present application provides a signal isolation and transmission device, aiming at solving the problems of small bandwidth and weak anti-interference capability of the existing signal isolation and transmission device.

The present application is realized as follows, a signal isolation and transmission device is provided, including a high-frequency amplitude modulation circuit, a signal demodulation circuit, a first H-field antenna and a second H-field antenna;

the first H-field antenna and second H-field antenna are both loop antennas with an external conductive shielding layer, and an insulating layer is wrapped outside the conductive shielding layer; and annular parts of the first H-field antenna and second H-field antenna face each other and abut each other;

the high-frequency amplitude modulation circuit is connected with a pin of the first H-field antenna, and a pin of the second H-field antenna is connected with the signal demodulation circuit; and when the high-frequency amplitude modulation circuit is connected with a device to be tested, the high-frequency amplitude modulation circuit receives a signal to be tested output by the device to be tested, modulates the signal to be tested onto a high-frequency carrier signal to obtain a first high-frequency modulation signal, and transmits the first high-frequency modulation signal to the first H-field antenna, the first H-field antenna converts the first high-frequency modulation signal into a magnetic signal, and then the magnetic signal is transmitted to the second H-field antenna through magnetic field coupling, the second H-field antenna converts the magnetic signal into a second high-frequency modulation signal and transmits the second high-frequency modulation signal to the signal demodulation circuit. And the signal demodulation circuit restores a demodulated signal proportional to the signal to be tested according to the second high-frequency modulation signal.

Optionally, distance between the annular parts of the first H-field antenna and second H-field antenna is less than or equal to 10 mm.

Optionally, the first H-field antenna and second H-field antenna are arranged in a magnetic shielding box, and the magnetic shielding box is made of nickel-zinc ferrite material.

Optionally, the magnetic shielding box further includes a cylindrical magnetic core, the cylindrical magnetic core passes through the annular parts of the first H-field antenna and second H-field antenna, both ends of the cylindrical magnetic core are respectively in contact with two opposite inner surfaces of the magnetic shielding box.

Optionally, a pin of the second H-field antenna is connected with the signal demodulation circuit through a coaxial cable.

Optionally, the coaxial cable passes through a magnetic bead.

Optionally, the high-frequency amplitude modulation circuit includes:

a voltage regulating circuit and an amplitude modulation circuit;

an output end of the voltage regulating circuit is connected with an input end of the amplitude modulation circuit, and an output end of the amplitude modulation circuit is connected with the first H-field antenna;

when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

Optionally, the voltage regulating circuit includes:

a first resistor, a second resistor, a third resistor, a first operational amplifier, a fourth resistor, a fifth resistor and a sixth resistor;

a first end of the first resistor is used as an input end of the voltage regulating circuit, a first end of the second resistor is connected to a floating output, a first end of the third resistor is connected to a first bias voltage, and a common of a second end of the first resistor, a second end of the second resistor and a second end of the third resistor is connected to a non-inverting input end of the first operational amplifier;

a common between a first end of the fourth resistor and a first end of the fifth resistor is connected with an inverting input end of the first operational amplifier, a second end of the fourth resistor is connected with a floating output, a common between a second end of the fifth resistor and an output end of the first operational amplifier is connected with a first end of the sixth resistor, and a second end of the sixth resistor is used as an output end of the voltage regulating circuit.

Optionally, the amplitude modulation circuit includes:

a mixer/multiplier, a high-frequency carrier signal source;

a first input end of the mixer/multiplier is connected with the output end of the voltage regulating circuit, and a second input end is connected with an output end of the high-frequency carrier signal source;

an output end of the mixer/multiplier is connected with the first H-field antenna.

Optionally, the signal demodulation circuit includes:

a first high-pass filter, a RF amplifier, a second high-pass filter, a detector, a low-pass filter and a second operational amplifier;

an input end of the first high-pass filter is used as an input end of the signal demodulation circuit, and an output end is connected with an input end of the RF amplifier;

an output end of the RF amplifier is connected with an input end of the second high-pass filter;

an output end of the second high-pass filter is connected with an input end of the detector;

an output end of the detector is connected with an input end of the low-pass filter;

an output end of the low-pass filter is connected with a non-inverting input end of the second operational amplifier;

an inverting input end of the second operational amplifier is connected with a second bias voltage, and an output end is used as an output end of the signal demodulation circuit.

The signal isolation and transmission device provided by the present application includes a high-frequency amplitude modulation circuit, a signal demodulation circuit, a first H-field antenna, and a second H-field antenna. The high-frequency amplitude modulation circuit and a pin of the first H-field antenna are connected to form a primary circuit, and a pin of the second H-field antenna are connected with the signal demodulation circuit to form a secondary circuit, and a signal to be tested is modulated onto a high-frequency carrier signal for isolation and transmission through the high-frequency amplitude modulation circuit, thus greatly improving the anti-interference effect. In addition, the first H-field antenna and second H-field antenna are both loop antennas with an external conductive shielding layer, and the conductive shielding layer is wrapped with an insulating layer, so that the primary side and the secondary side are completely electrically isolated, which not only improves the voltage withstand degree but also does not affect the transmission of RF signals. And, by arranging the annular parts of the first H-field antenna and second H-field antenna to face and abut each other, the attenuation degree of the received and transmitted signals is greatly reduced, and the coupling degree of the signals is improved.

BRIEF DESCRIPTION OF DRAWINGS

In order to more clearly illustrate the technical solution of the embodiments of the present application, the drawings in the description of the embodiments or the prior art is briefly introduced as follows. Obviously, the drawings in the following description are only some embodiments of the present application, and for those skilled in the art, other drawings may be obtained according to these drawings without any creative effort.

DETAILED DESCRIPTION OF DISCLOSED EMBODIMENTS

In order to make the purpose, technical solution and advantages of the present application clearer, the present application will be further described in detail below with reference to the drawings and embodiments. It should be understood that the specific embodiments described here are only used to illustrate the application, not to limit the application.

Figure 1:
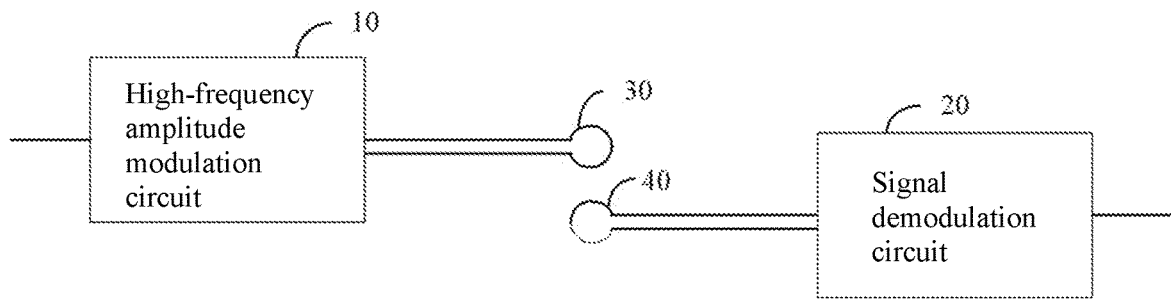
FIG. 1 is a schematic circuit diagram of a signal isolation and transmission device provided by an embodiment of the present application.

The present application provides a signal isolation and transmission device, which can be used for detecting broadband voltage signals in the field of electronic appliances. A device to be tested is connected with the high-frequency amplitude modulation circuit, a signal to be tested is received and then modulated onto a high-frequency carrier signal to obtain a first high-frequency modulation signal, which is converted into a magnetic signal through the first H-field antenna, then the magnetic signal is received by the second H-field antenna and converted into a second high-frequency modulation signal, which is transmitted to the signal demodulation circuit. And finally the signal demodulation circuit restores a demodulated signal proportional to the signal to be tested according to the second high-frequency modulation signal. FIG. 1 is a schematic circuit diagram of a signal isolation and transmission device provided by an embodiment of the present application. As shown in FIG. 1, the signal isolation and transmission device includes a high-frequency amplitude modulation circuit 10, a signal demodulation circuit 20, a first H-field antenna 30 and a second H-field antenna 40;

the first H-field antenna 30 and second H-field antenna 40 are both loop antennas with an external conductive shielding layer, and an insulating layer is wrapped outside the conductive shielding layer; and annular parts of the first H-field antenna 30 and second H-field antenna 40 face each other and abut each other;

the high-frequency amplitude modulation circuit 10 is connected with a pin of the first H-field antenna 30, and a pin of the second H-field antenna 40 is connected with the signal demodulation circuit 20; and when the high-frequency amplitude modulation circuit 10 is connected with a device to be tested, the high-frequency amplitude modulation circuit 10 receives a signal to be tested output by the device to be tested, modulates the signal to be tested onto a high-frequency carrier signal to obtain a first high-frequency modulation signal, and transmits the first high-frequency modulation signal to the first H-field antenna 30, the first H-field antenna 30 converts the first high-frequency modulation signal into a magnetic signal, and then the magnetic signal is transmitted to the second H-field antenna 40 through magnetic field coupling, the second H-field antenna 40 converts the magnetic signal into a second high-frequency modulation signal and transmits the second high-frequency modulation signal to the signal demodulation circuit 20. And the signal demodulation circuit 20 restores a demodulated signal proportional to the signal to be tested according to the second high-frequency modulation signal.

In this embodiment, the high-frequency amplitude modulation circuit 10 and a pin of the first H-field antenna 30 are connected to form a primary circuit, and a pin of the second H-field antenna 40 are connected with the signal demodulation circuit 20 to form a secondary circuit. The first H-field antenna 30 transmits electromagnetic waves, and the second H-field antenna 40 receives electromagnetic waves to complete the isolation and transmission of signals.

The high-frequency amplitude modulation circuit 10 is used to receive a signal to be tested output by a device to be tested, and modulate the signal to be tested onto a high-frequency carrier signal. The device to be tested is usually a high-voltage circuit, such as switching power supply, inverter, motor, etc. There are a lot of common-mode interference signals around the environment of these high-voltage circuits, the frequency of which is below 100 MHz. In this embodiment, the signal to be tested is modulated to a high-frequency signal source with a frequency far greater than that of the interference signals by the high-frequency amplitude modulation circuit 10, such as a high-frequency signal of 1.5 GHz, so as to reduce the common-mode interference signals in the signal transmission process.

The first H-field antenna 30 is used to convert the first high-frequency modulation signal output by the high-frequency amplitude modulation circuit 10 into a magnetic signal, and the magnetic signal is transmitted to the second H-field antenna 40 through magnetic field coupling, and the second H-field antenna 40 is used to convert the magnetic signal into a second high-frequency modulation signal and transmit it to the signal demodulation circuit 20. The first H-field antenna 30 and second H-field antenna 40 are both loop antennas 21 with an external conductive shielding layer, and an insulating layer is wrapped outside the conductive shielding layer, such as a coaxial line with an external insulating material, so that the first H-field antenna 30 and second H-field antenna 40 only respond to the magnetic field, but hardly respond to the external interference electric field. The primary circuit and the secondary circuit are completely electrically isolated, which not only improves the withstand voltage but also does not affect the transmission of radio frequency signals. Furthermore, in order to eliminate the short circuit of magnetic field, an insulating gap 22 is cut on each conductive shielding layer. It should be noted that the loop antenna described herein refers to the antenna enclosed as a whole, which may be circular or other loops, such as square, rectangular, triangular, etc. Furthermore, the distance and relative position between the first H-field antenna 30 and second H-field antenna 40 determine the attenuation degree of signal transmission and reception. In this embodiment, the annular parts of the first H-field antenna 30 and second H-field antenna 40 face each other and abut each other. Therefore, the magnetic fields of the first H-field antenna 30 and second H-field antenna 40 are well coupled, which is beneficial to reducing the attenuation degree of signals.

Figure 2:
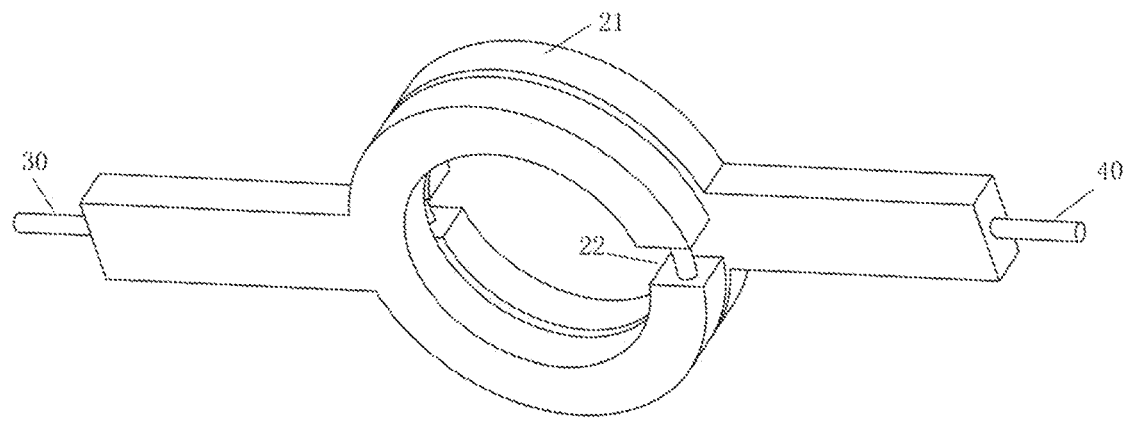
FIG. 2 is a schematic diagram of the positions of a first H-field antenna and second H-field antenna provided by an embodiment of the present application.

Optionally, as a preferred embodiment of the present application, as shown in FIG. 2, when the first H-field antenna 30 and second H-field antenna 40 are opposite to and abut each other, for example, when the distance between the annular parts of each other is less than or equal to 10 mm, the minimum attenuation signal may be obtained. It can also prevent the second H-field antenna 40 of the secondary side from being influenced by the common-mode interference signal generated by the conductive shielding layer of the first H-field antenna 30 of the primary side. The experimental results show that the signal attenuation may be controlled within the range of −10 DB.

Figure 3:
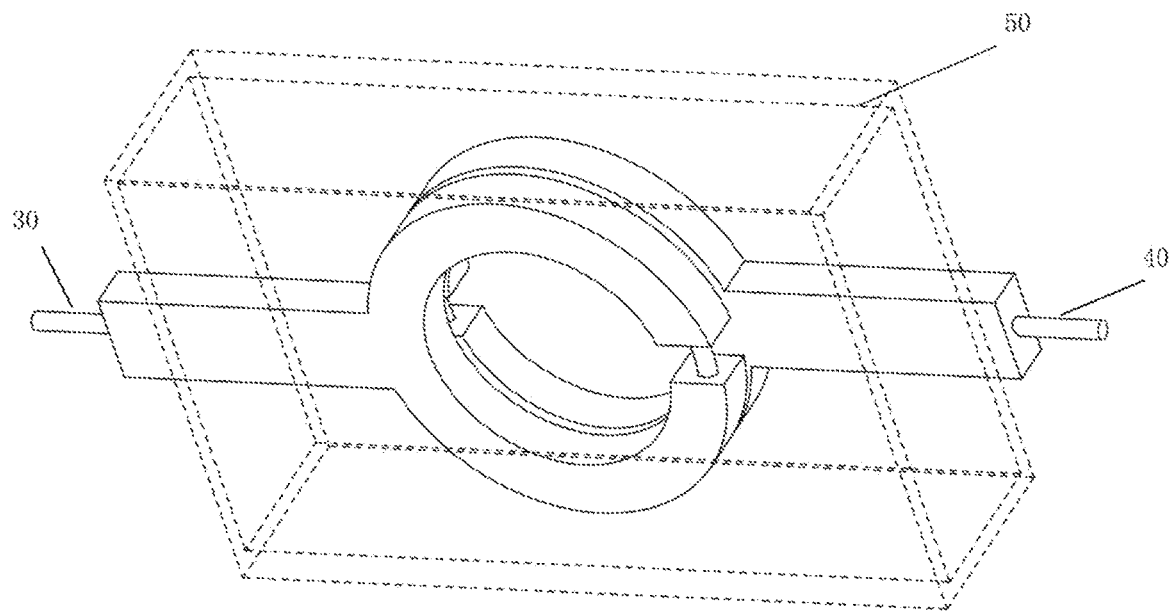
FIG. 3 is a schematic diagram of the positions of a first H-field antenna and second H-field antenna provided by an embodiment of the present application.

Optionally, as a preferred embodiment of the present application, as shown in FIG. 3, the first H-field antenna 30 and second H-field antenna 40 are arranged in a magnetic shielding box 50, and the magnetic shielding box 50 is made of nickel-zinc ferrite material. Magnetic shielding is carried out by adding magnetic materials outside the two magnetic field antennas, for example, the two magnetic field antennas are both sleeved with a magnetically conductive cavity or box 50, which effectively avoids the interference of the first H-field antenna 30 as a transmitting end to the outside and the influence of the external interference electromagnetic field on the second H-field antenna 40 as a receiving end, and greatly inhibits the absorption of the external space interference electromagnetic wave by the magnetic field antenna. The first high-frequency modulation signal transmitted from the primary side is not affected, but can still be effectively transmitted to the secondary side through magnetic field coupling. It should be noted that in FIG. 3, the magnetic shielding box 50 is represented by dotted lines. The magnetic shielding box 50 is represented as a rectangular parallelepiped, which is only one embodiment of the present application. And the shape of the magnetic shielding box 50 may also be cylindrical, etc., which is not limited here.

Figure 4:
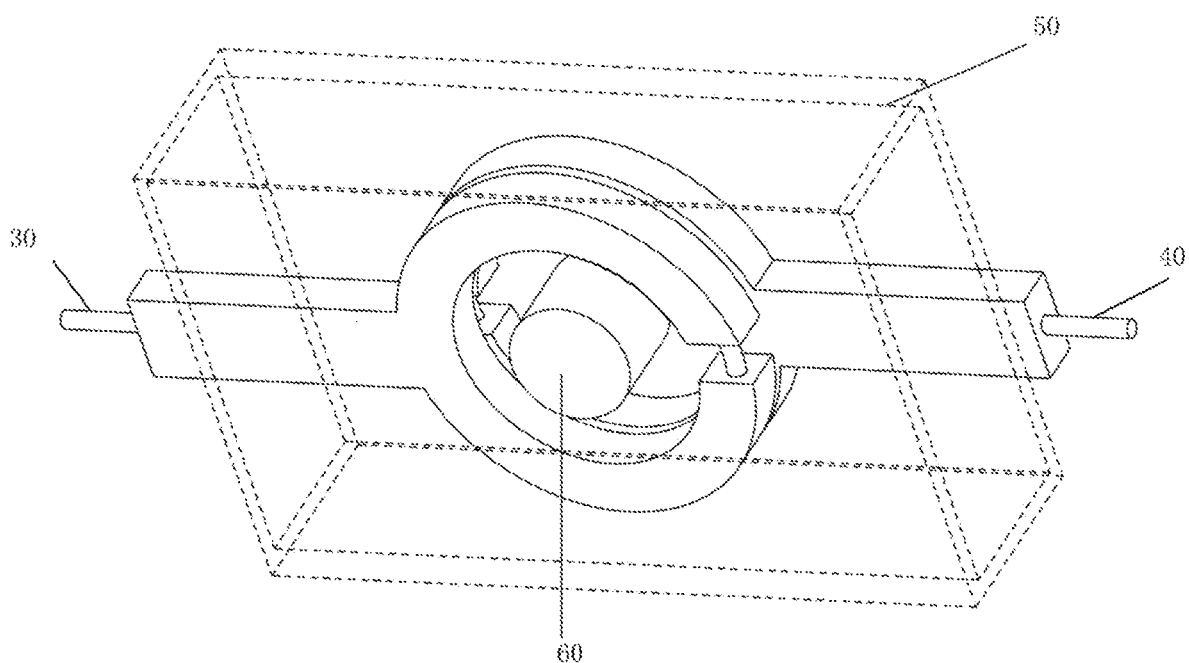
FIG. 4 is a schematic diagram of the positions of a first H-field antenna and second H-field antenna provided by an embodiment of the present application.

Optionally, as a preferred embodiment of the present application, as shown in FIG. 4, the magnetic shielding box 50 further includes a cylindrical magnetic core 60, which passes through the annular parts of the first H-field antenna 30 and second H-field antenna 40, both ends of the cylindrical magnetic core are respectively in contact with two opposite inner surfaces of the magnetic shielding box 50. In this embodiment, based on the embodiment of FIG. 3, a magnetic core 60 is added inside the magnetic shielding box 50, and the cylindrical magnetic core 60 passes through the annular parts of the first H-field antenna 30 and second H-field antenna 40 to enhance the signal strength received by the second H-field antenna 40 while reducing the signal noise. Optionally, the material of the cylindrical magnetic core 60 is preferably a non-conductive high-frequency magnetic material, such as nickel zinc ferrite. It should be noted that the cylindrical magnetic core 60 in FIG. 4 is shown as a cylinder, which is only one embodiment of the present application, and the shape of the cylindrical magnetic core 60 may also be a cuboid, etc., which is not limited here.

The signal demodulation circuit 20 is used to receive the second high-frequency modulation signal received by the second H-field antenna 40, and restore a demodulated signal proportional to the signal to be tested according to the second high-frequency modulation signal. As described above, the high-frequency amplitude modulation circuit 10 obtains the first high-frequency modulation signal by modulating the signal to be tested onto the high-frequency carrier signal, so when restoring the signal to be tested, the signal demodulation circuit 20 mainly filters the second high-frequency modulation signal with a multistage high-pass filter to filter out all common-mode interference signals, and finally a demodulation signal is obtained. The demodulation signal is provided to a test instrument, such as an oscilloscope.

Figure 5:
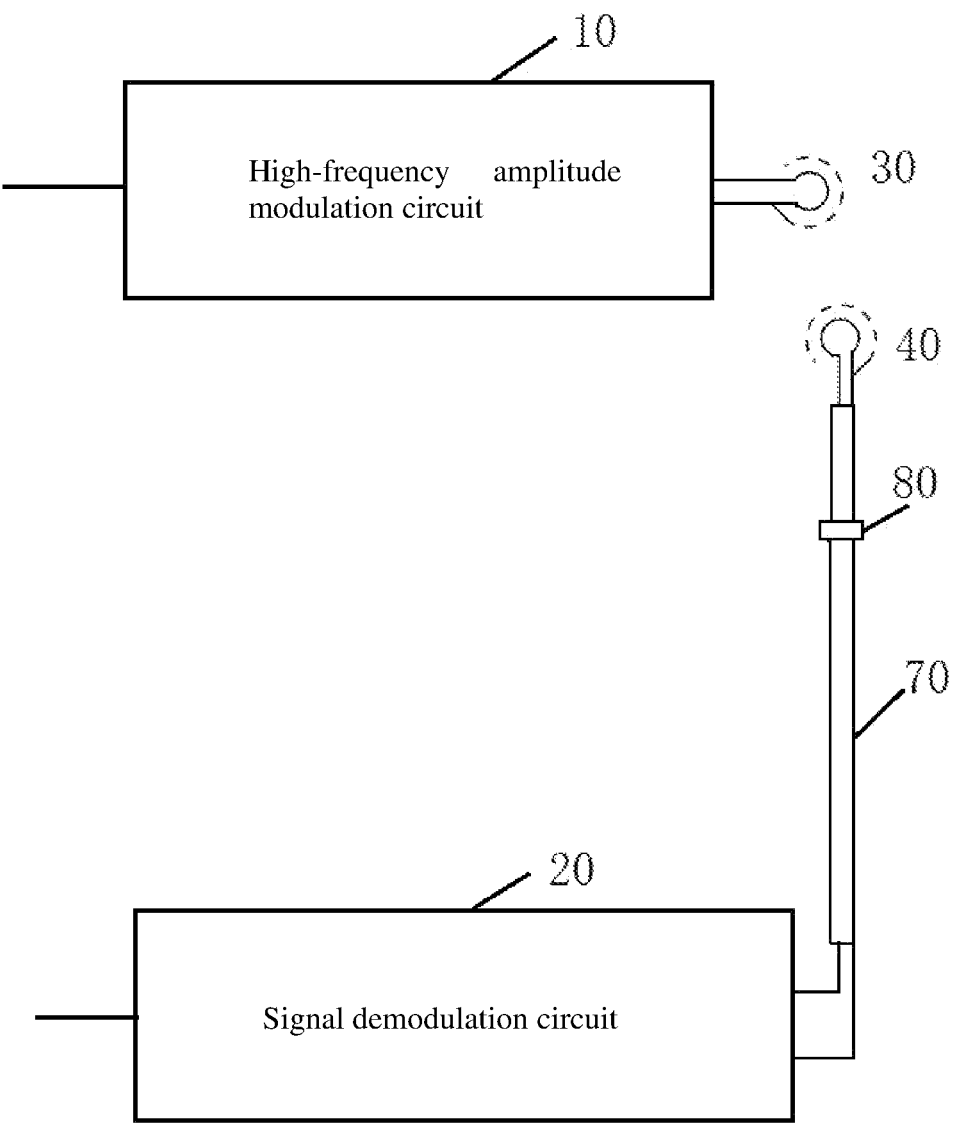
FIG. 5 is a schematic circuit diagram of a signal isolation and transmission device provided by an embodiment of the present application.

Optionally, as a preferred embodiment of the present application, as shown in FIG. 5, a pin of the second H-field antenna 40 is connected with the signal demodulation circuit 20 through a coaxial cable 70. Optionally, the length of the coaxial cable 70 is greater than or equal to 2 m. The second high-frequency modulation signal received by the second H-field antenna 40 is transmitted to the signal demodulation circuit 20 through the coaxial cable 70, which is beneficial to extend the measurement range and is suitable for the environment where the device to be tested is far away from the test instrument. Interference signals received by the coaxial cable 70 may also be filtered by the signal demodulation circuit 20 to reduce the influence of interference signals.

Optionally, as a preferred embodiment of the present application, as shown in FIG. 5, the signal isolation and transmission device further includes a magnetic bead 80, and the coaxial cable 70 passes through the magnetic bead 80. In this embodiment, the magnetic bead 80 absorbs the interference signals generated by the space electromagnetic field to reduce the interference signals received by the coaxial cable 70.

In this embodiment, a signal to be tested is modulated onto a high-frequency carrier signal by the high-frequency amplitude modulation circuit 10, and a first high-frequency modulated signal is obtained, which is converted into a magnetic signal through the first H-field antenna 30, then the magnetic signal is received by the second H-field antenna 40 and converted into a second high-frequency modulation signal. Finally, the signal demodulation circuit 20 restores a demodulated signal according to the second high-frequency modulation signal. With the high-frequency carrier modulation and demodulation technology, the low-frequency interference signal is effectively avoided in the signal transmission process, and the anti-interference ability of the existing signal isolation and transmission device is improved.

Figure 6:
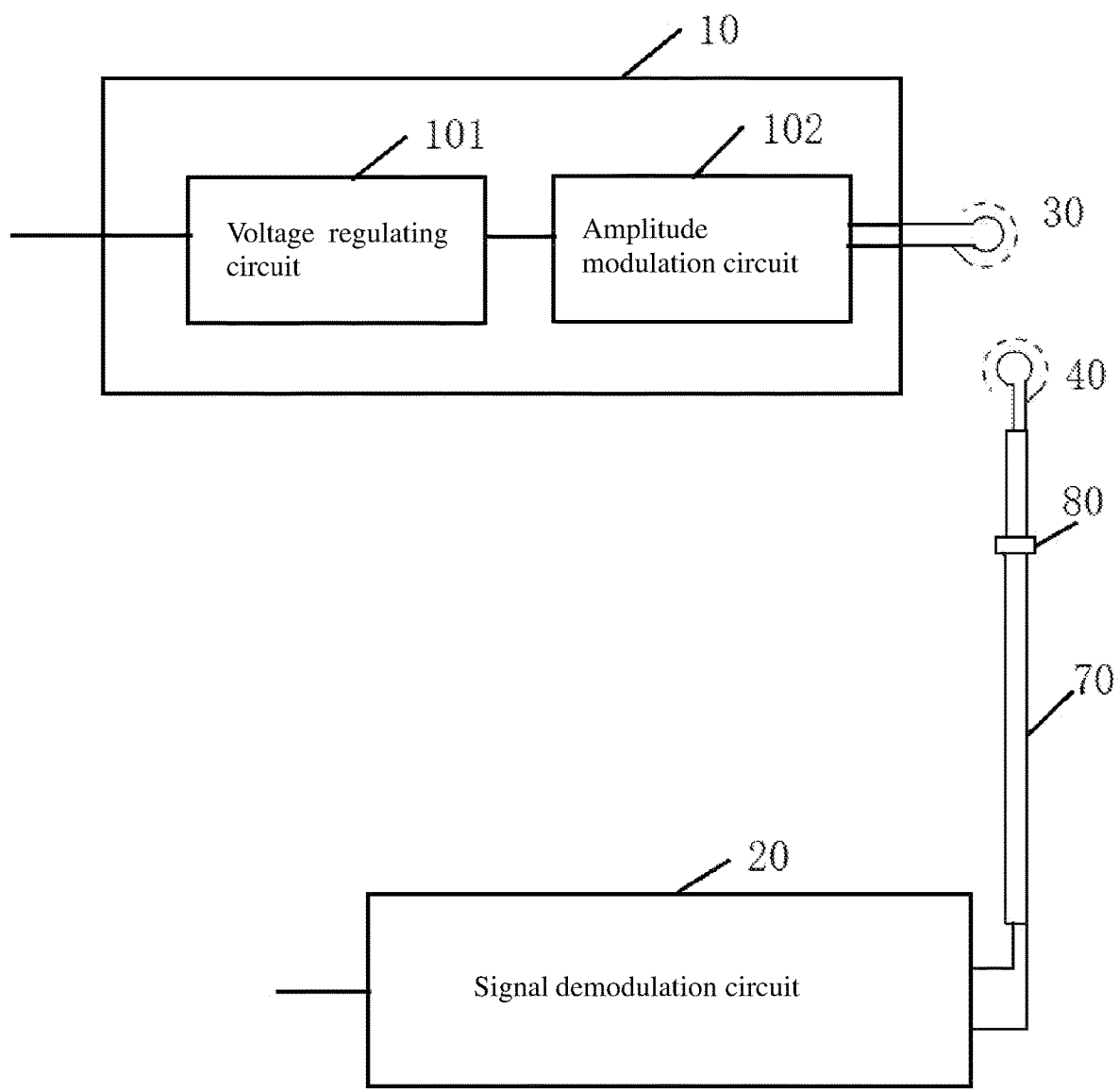
FIG. 6 is a schematic circuit diagram of a high-frequency amplitude modulation circuit provided by an embodiment of the present application.

As described above, the high-frequency amplitude modulation circuit 10 is used to receive a signal to be tested output by a device to be tested, and modulate the signal to be tested onto a high-frequency carrier signal. Optionally, as a preferred embodiment of the present application, as shown in FIG. 6, the high-frequency amplitude modulation circuit 10 includes a voltage regulating circuit 101 and an amplitude modulation circuit 102;

an output end of the voltage regulating circuit 101 is connected with an input end of the amplitude modulation circuit 102, and an output end of the amplitude modulation circuit 102 is connected with the first H-field antenna 30;

when the high-frequency amplitude modulation circuit 10 is connected with a device to be tested, the voltage regulating circuit 101 receives a signal to be tested output by the device to be tested, and regulates the signal to be tested into a positive signal, then the positive signal is transmitted to the amplitude modulation circuit 102, the amplitude modulation circuit 102 modulates the positive signal onto a high-frequency carrier signal to obtain a first high-frequency modulation signal, and transmits the first high-frequency modulation signal to the first H-field antenna 30.

In this embodiment, the voltage regulating circuit 101 is used to receive the signal to be tested and adjust the signal to be tested into a positive signal. The amplitude modulation circuit 102 modulates the positive signal onto a high-frequency carrier signal, a first high-frequency modulation signal is obtained. Because the signal to be tested is a bipolar signal with positive and negative signals, and the amplitude modulation circuit 102 can only handle positive voltage, it is necessary to adjust the signal to be tested to a completely positive signal by the voltage regulating circuit 101. Optionally, the voltage regulating circuit 101 and the amplitude modulation circuit 102 may also be installed in a shielding box to shield the common-mode electromagnetic interference in the external space where the device to be tested is located.

Figure 7:
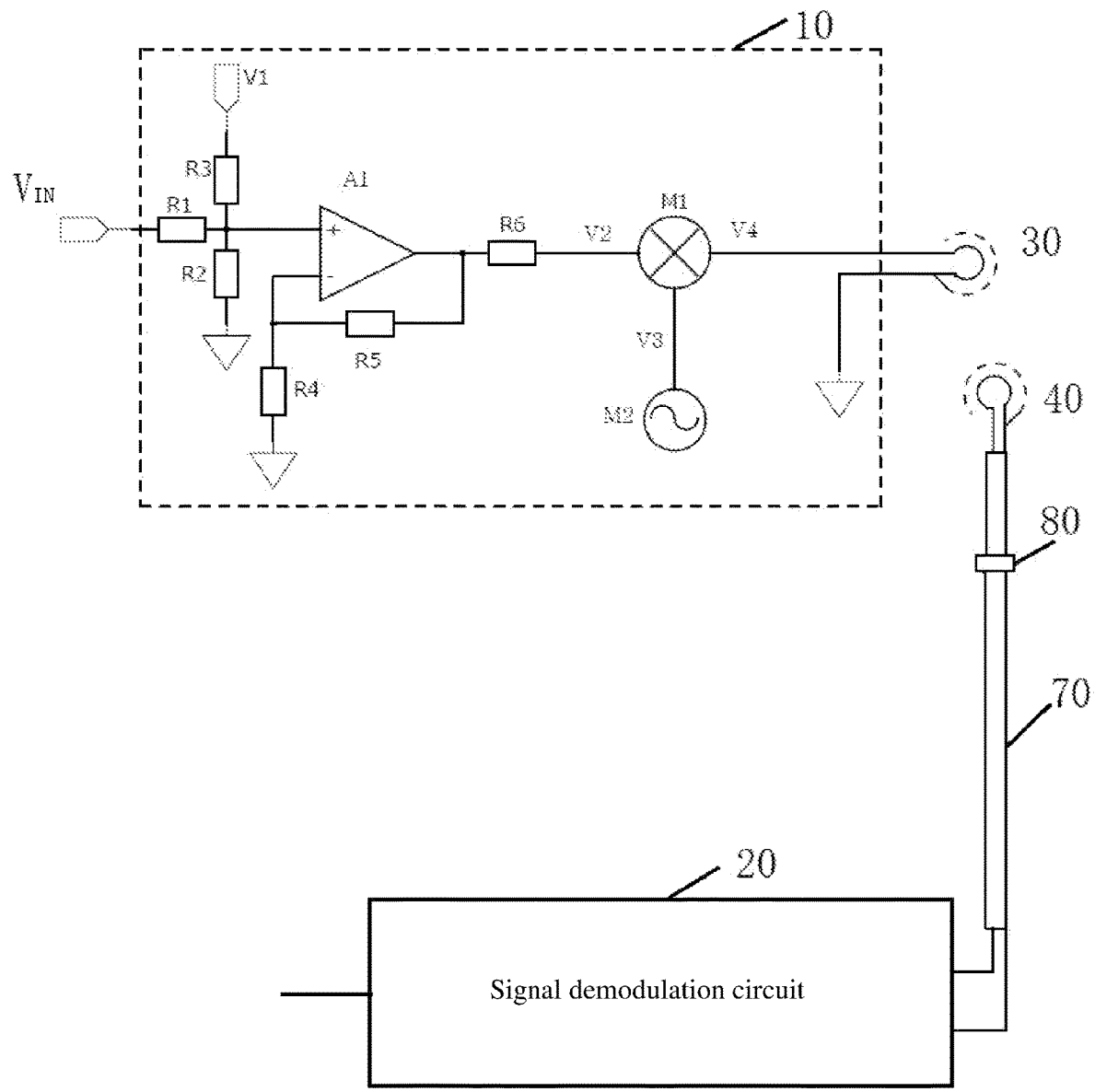
FIG. 7 is a schematic circuit diagram of a high-frequency amplitude modulation circuit provided by an embodiment of the present application.

Specifically, as an embodiment of the present application, as shown in FIG. 7, the voltage regulating circuit 101 includes:

A first resistor R1, a second resistor R2, a third resistor R3, a first operational amplifier A1, a fourth resistor R4, a fifth resistor R5 and a sixth resistor R6;

a first end of the first resistor R1 is used as an input end of the voltage regulating circuit 101, a first end of the second resistor R2 is connected to a floating output, a first end of the third resistor R3 is connected to a first bias voltage, and a common of a second end of the first resistor R1, a second end of the second resistor R2 and a second end of the third resistor R3 is connected to a non-inverting input end of the first operational amplifier A1;

a common between a first end of the fourth resistor R4 and a first end of the fifth resistor R5 is connected with an inverting input end of the first operational amplifier A1, a second end of the fourth resistor R4 is connected with a floating output, a common between a second end of the fifth resistor R5 and an output end of the first operational amplifier A1 is connected with a first end of the sixth resistor R6, and a second end of the sixth resistor R6 is used as an output end of the voltage regulating circuit 101.

In the present application, the first resistor R1 and the second resistor R2 constitute an attenuator, which is used to adjust the signal to be tested to a voltage signal with an appropriate size and then transmit it to the first operational amplifier A1. The third resistor R3 and the first bias voltage constitute a voltage summing circuit, which is used to adjust the signal to be tested into a positive voltage signal, so as to adapt to the subsequent amplitude modulation circuit 102. The first operational amplifier A1, fourth resistor R4, fifth resistor R5 and sixth resistor R6 together constitute an amplifier circuit for amplifying the input signal. Optionally, the first operational amplifier A1 may be an AD8055 amplifier.

Specifically, as an embodiment of the present application, as shown in FIG. 7, the amplitude modulation circuit 102 includes:

a mixer/multiplier M1, a high-frequency carrier signal source M2;

a first input end of the mixer/multiplier M1 is connected with the output end of the voltage regulating circuit 101, and a second input end is connected with an output end of the high-frequency carrier signal source M2;

an output end of the mixer/multiplier M1 is connected with the first H-field antenna 30.

In the present application, the high-frequency carrier signal source M2 generates a high-frequency local oscillation signal and inputs the local oscillation signal to the mixer/multiplier M1. The mixer/multiplier M1 is used to multiply the voltage signal output by the voltage regulating circuit 101 with the local oscillation signal, so as to modulate the voltage signal output by the voltage regulating circuit 101 onto the local oscillation signal to obtain a first high-frequency modulation signal, thereby completing the amplitude modulation for the signal to be tested. Optionally, the mixer/multiplier M1 includes, but is not limited to, an AD835 multiplier, an ADE-1 mixer and an ADE30 mixer.

A pin of the first H-field antenna 30 is connected to an output end of the mixer/multiplier M1, and the other pin is connected to the floating output. The first H-field antenna 30 receives the first high-frequency modulation signal and transmits electromagnetic waves to the second H-field antenna 40 according to the first high-frequency modulation signal. The second high-frequency modulation signal received by the second H-field antenna 40 is then transmitted to the signal demodulation circuit 20 through the coaxial cable 70.

Figure 8:
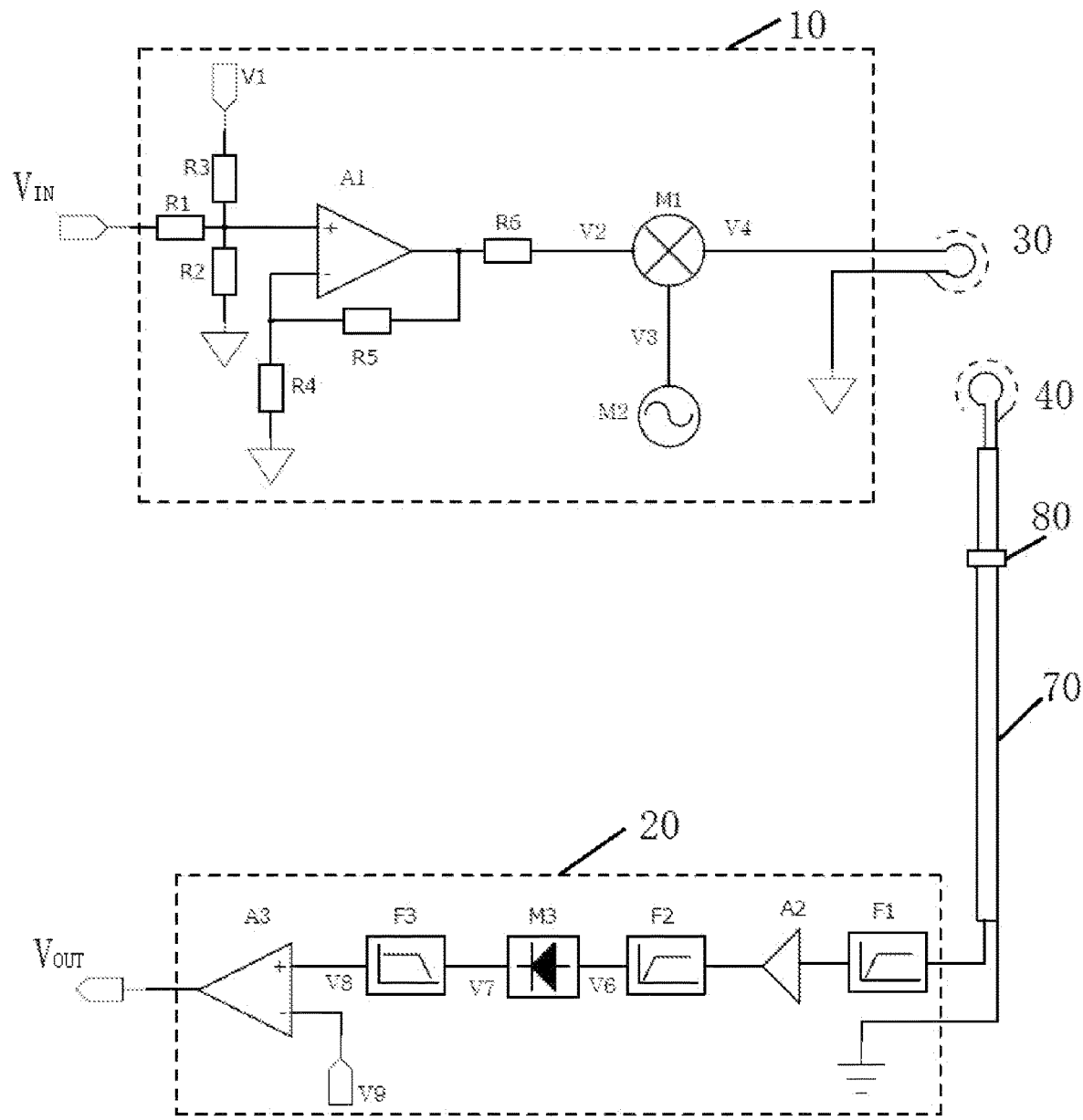
FIG. 8 is a schematic circuit diagram of a signal demodulation circuit provided by an embodiment of the present application.

Specifically, as an embodiment of the present application, as shown in FIG. 8, the signal demodulation circuit 20 includes:

a first high-pass filter F1, a RF amplifier A2, a second high-pass filter F2, a detector M3, a low-pass filter F3 and a second operational amplifier A3;

an input end of the first high-pass filter F1 is used as an input end of the signal demodulation circuit 20, and an output end is connected with an input end of the RF amplifier A2;

an output end of the RF amplifier A2 is connected with an input end of the second high-pass filter F2;

an output end of the second high-pass filter F2 is connected with an input end of the detector M3;

an output end of the detector M3 is connected with an input end of the low-pass filter F3;

an output end of the low-pass filter F3 is connected with a non-inverting input end of the second operational amplifier A3;

an inverting input end of the second operational amplifier A3 is connected with a second bias voltage, and an output end is used as an output end of the signal demodulation circuit 20.

A pin of the second H-field antenna 40 is connected to the input end of the first high-pass filter F1, and the other pin is grounded. As described above, the second high-frequency modulation signal is transmitted to the signal demodulation circuit 20 through the coaxial cable 70, and may already carry interference signals with lower frequency, such as interference signals below 100 MHz. In order to improve the anti-interference performance, in the present embodiment, the first high-pass filter F1 and second high-pass filter F2 are provided to filter the second high-frequency modulation signal, so as to filter out the interference signals below 100 MHz and allow the high-frequency modulation signal to pass through.

The RF amplifier A2 is used to amplify the primary filtered signal output by the first high-pass filter F1 and improve the signal-to-noise ratio to make up for the loss in the signal transmission process. Optionally, the RF amplifier A2 includes but is not limited to ERA-1, ERA-2 and ERA-3.

The detector M3 is used to change the secondary filtered signal output by the second high-pass filter F2 into a unidirectional DC signal to obtain a forward high-frequency modulation signal. Optionally, the detector M3 includes but is not limited to a diode.

The low-pass filter F3 is used to filter out the high-frequency carrier signal in the unidirectional DC signal output by the detector M3, such as the high-frequency carrier signal of 1.5 GHz, to obtain a forward demodulation signal. The forward demodulation signal also includes a first bias voltage superimposed by the voltage regulating circuit of the primary side.

Preferably, a differential operational amplifier is used as the second operational amplifier A3 to form a subtraction circuit, which is used to subtract a preset second bias voltage from the forward demodulation signal, restore a bipolar demodulated signal, and obtain a demodulated signal proportional to the signal to be tested.

It can be seen that in this embodiment, interference signals below 100 MHz are filtered by the first high-pass filter F1 and second high-pass filter F2, and high-frequency carrier signals of 1.5 GHz are filtered by the low-pass filter F3. Therefore, the signal isolation and transmission device can transmit the signal to be tested from DC to several hundred MHz, effectively expanding the bandwidth range of the signal isolation and transmission device.

Figure 9:
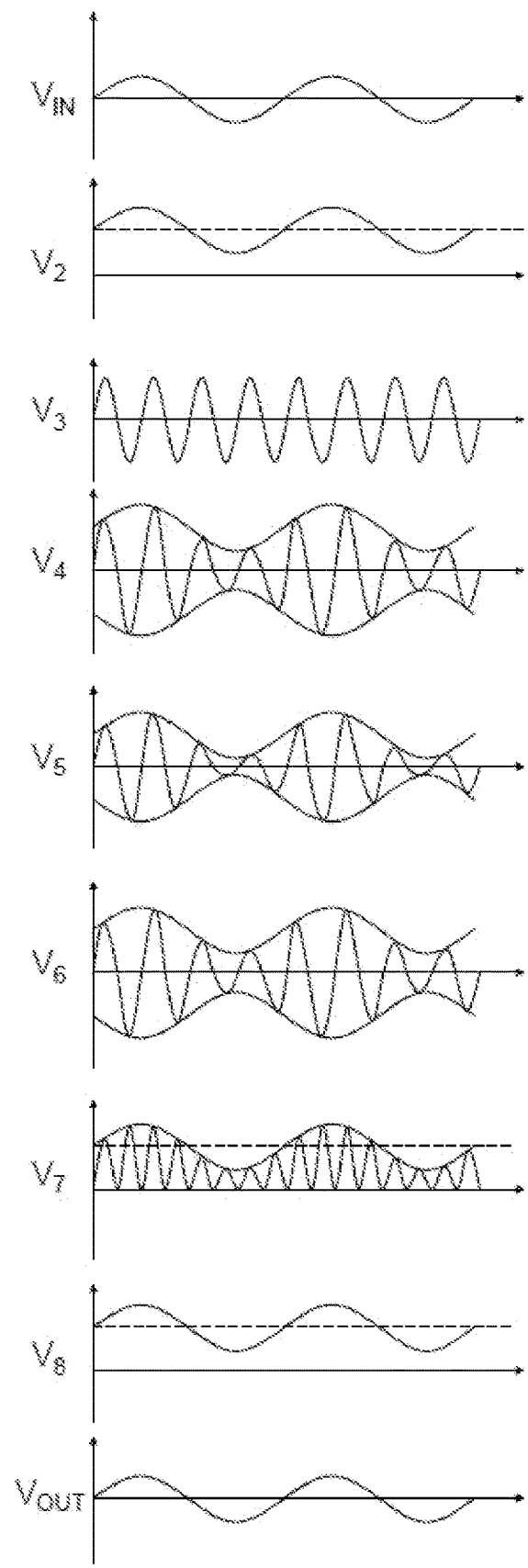
FIG. 9 is a schematic diagram of waveform conversion from a signal to be test ($V_{IN}$) to a bipolar demodulated signal ($V_{OUT}$) according to an embodiment of the present application.

Optionally, for the convenience of understanding, as shown in FIG. 9, this embodiment provides a schematic diagram of waveform conversion from a signal to be test ($V_{IN}$) to a bipolar demodulated signal ($V_{OUT}$). Where $V_{IN}$ represents the signal to be tested, which is a sine wave in this embodiment; V2 represents the voltage signal output through the voltage regulating circuit 101; V3 indicates that the high-frequency carrier signal source M2 generates a high-frequency local oscillation signal; V4 represents the first high-frequency modulation signal output by mixer/multiplier M1; V5 represents the second high-frequency modulation signal output by the second H-field antenna 40; V6 represents the secondary filtered signal output by the second high-pass filter F2; V7 represents the unidirectional DC signal output by detector M3; V8 represents the forward demodulation signal output by low-pass filter F3; \Tom' represents a bipolar demodulated signal, that is, a demodulated signal proportional to the signal to be tested ($V_{IN}$).

The above embodiments are only used to illustrate the technical solutions of the present application, rather than limiting it. Although the present application has been described in detail with reference to the foregoing embodiments, those skilled in the art will appreciate that it is still possible to modify the technical solutions described in the foregoing embodiments, or equivalently replace some of its technical features. However, these modifications or substitutions do not make the essence of the corresponding technical solutions deviate from the spirit and scope of the technical solutions of each embodiment of the present application, and shall be included in the scope of protection of the present application.

What is claimed is:

1. A signal isolation and transmission device, comprising: a high-frequency amplitude modulation circuit, a signal demodulation circuit, a first H-field antenna and a second H-field antenna;

the first H-field antenna and second H-field antenna are both loop antennas with an external conductive shielding layer, and an insulating layer is wrapped outside the conductive shielding layer; and annular parts of the first H-field antenna and second H-field antenna face each other and abut each other;

the high-frequency amplitude modulation circuit is connected with a first pin of the first H-field antenna, and a second pin of the second H-field antenna is connected with the signal demodulation circuit; and when the high-frequency amplitude modulation circuit is connected with a device to be tested, the high-frequency amplitude modulation circuit receives a signal to be tested output by the device to be tested, modulates the signal to be tested onto a high-frequency carrier signal to obtain a first high-frequency modulation signal, and transmits the first high-frequency modulation signal to the first H-field antenna, the first H-field antenna converts the first high-frequency modulation signal into a magnetic signal, and then the magnetic signal is transmitted to the second H-field antenna through magnetic field coupling, the second H-field antenna converts the magnetic signal into a second high-frequency modulation signal and transmits the second high-frequency modulation signal to the signal demodulation circuit, and the signal demodulation circuit restores a demodulated signal proportional to the signal to be tested according to the second high-frequency modulation signal.

2. The signal isolation and transmission device of claim 1, wherein distance between the annular parts of the first H-field antenna and second H-field antenna is less than or equal to 10mm.

3. The signal isolation and transmission device of claim 1, wherein the first H-field antenna and second H-field antenna are arranged in a magnetic shielding box, and the magnetic shielding box is made of nickel-zinc ferrite material.

4. The signal isolation and transmission device of claim 3, wherein the magnetic shielding box further comprises a cylindrical magnetic core, the cylindrical magnetic core passes through the annular parts of the first H-field antenna and second H-field antenna, both ends of the cylindrical magnetic core are respectively in contact with two opposite inner surfaces of the magnetic shielding box.

5. The signal isolation and transmission device of claim 1, wherein a pin of the second H-field antenna is connected with the signal demodulation circuit through a coaxial cable.

6. The signal isolation and transmission device of claim 5, wherein the coaxial cable passes through a magnetic bead.

7. The signal isolation and transmission device of claim 1, wherein the high-frequency amplitude modulation circuit comprises:
  a voltage regulating circuit and an amplitude modulation circuit;
  an output end of the voltage regulating circuit is connected with an input end of the amplitude modulation circuit, and an output end of the amplitude modulation circuit is connected with the first H-field antenna;
  when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

8. The signal isolation and transmission device of claim 7, wherein the voltage regulating circuit comprises:
  a first resistor, a second resistor, a third resistor, a first operational amplifier, a fourth resistor, a fifth resistor and a sixth resistor;
  a first end of the first resistor is used as an input end of the voltage regulating circuit, a first end of the second resistor is connected to a floating output, a first end of the third resistor is connected to a first bias voltage, and a common of a second end of the first resistor, a second end of the second resistor and a second end of the third resistor is connected to a non-inverting input end of the first operational amplifier;
  a common between a first end of the fourth resistor and a first end of the fifth resistor is connected with an inverting input end of the first operational amplifier, a second end of the fourth resistor is connected with a floating output, a common between a second end of the fifth resistor and an output end of the first operational amplifier is connected with a first end of the sixth resistor, and a second end of the sixth resistor is used as an output end of the voltage regulating circuit.

9. The signal isolation and transmission device of claim 8, wherein the amplitude modulation circuit comprises:
  a mixer/multiplier, a high-frequency carrier signal source;
  a first input end of the mixer/multiplier is connected with the output end of the voltage regulating circuit, and a second input end is connected with an output end of the high-frequency carrier signal source;
  an output end of the mixer/multiplier is connected with the first H-field antenna.

10. The signal isolation and transmission device of claim 7, wherein the signal demodulation circuit comprises:
  a first high-pass filter, a RF amplifier, a second high-pass filter, a detector, a low-pass filter and a second operational amplifier;
  an input end of the first high-pass filter is used as an input end of the signal demodulation circuit, and an output end is connected with an input end of the RF amplifier;
  an output end of the RF amplifier is connected with an input end of the second high-pass filter;
  an output end of the second high-pass filter is connected with an input end of the detector;
  an output end of the detector is connected with an input end of the low-pass filter;
  an output end of the low-pass filter is connected with a non-inverting input end of the second operational amplifier;
  an inverting input end of the second operational amplifier is connected with a second bias voltage, and an output end is used as an output end of the signal demodulation circuit.

11. The signal isolation and transmission device of claim 2, wherein the high-frequency amplitude modulation circuit comprises:
  a voltage regulating circuit and an amplitude modulation circuit;
  an output end of the voltage regulating circuit is connected with an input end of the amplitude modulation circuit, and an output end of the amplitude modulation circuit is connected with the first H-field antenna;
  when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

12. The signal isolation and transmission device of claim 3, wherein the high-frequency amplitude modulation circuit comprises:
  a voltage regulating circuit and an amplitude modulation circuit;
  an output end of the voltage regulating circuit is connected with an input end of the amplitude modulation circuit, and an output end of the amplitude modulation circuit is connected with the first H-field antenna;

when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

13. The signal isolation and transmission device of claim 4, wherein the high-frequency amplitude modulation circuit comprises:
a voltage regulating circuit and an amplitude modulation circuit;
an output end of the voltage regulating circuit is connected with an input end of the amplitude modulation circuit, and an output end of the amplitude modulation circuit is connected with the first H-field antenna;
when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

14. The signal isolation and transmission device of claim 5, wherein the high-frequency amplitude modulation circuit comprises:
a voltage regulating circuit and an amplitude modulation circuit;
an output end of the voltage regulating circuit is connected with an input end of the amplitude modulation circuit, and an output end of the amplitude modulation circuit is connected with the first H-field antenna;
when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

15. The signal isolation and transmission device of claim 6, wherein the high-frequency amplitude modulation circuit comprises:
a voltage regulating circuit and an amplitude modulation circuit;
an output end of the voltage regulating circuit is connected with an input end of the amplitude modulation circuit, and an output end of the amplitude modulation circuit is connected with the first H-field antenna;
when the high-frequency amplitude modulation circuit is connected with a device to be tested, the voltage regulating circuit receives a signal to be tested output by the device to be tested, and regulates the signal to be tested into a positive signal, then the positive signal is transmitted to the amplitude modulation circuit, the amplitude modulation circuit modulates the positive signal onto a high-frequency carrier signal to obtain a first high-frequency modulation signal, and transmits the first high-frequency modulation signal to the first H-field antenna.

* * * * *